(12) United States Patent
Bergeron et al.

(10) Patent No.: US 10,207,916 B2
(45) Date of Patent: Feb. 19, 2019

(54) MEMS DEVICES ON FLEXIBLE SUBSTRATE

(71) Applicant: 3M INNOVATIVE PROPERTIES COMPANY, St. Paul, MN (US)

(72) Inventors: Phillip J. Bergeron, Austin, TX (US); Brent D. Lunceford, Austin, TX (US); John D. Geissinger, Austin, TX (US); Douglas B. Gundel, Cedar Park, TX (US); Justine A. Mooney, Austin, TX (US); Ravi Palaniswamy, Singapore (SG); Siang Sin Foo, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 25 days.

(21) Appl. No.: 15/306,569

(22) PCT Filed: May 11, 2015

(86) PCT No.: PCT/US2015/030158
§ 371 (c)(1),
(2) Date: Oct. 25, 2016

(87) PCT Pub. No.: WO2015/183534
PCT Pub. Date: Dec. 3, 2015

(65) Prior Publication Data
US 2017/0073215 A1 Mar. 16, 2017

Related U.S. Application Data

(60) Provisional application No. 62/004,016, filed on May 28, 2014.

(51) Int. Cl.
*B81B 3/00* (2006.01)
*B81C 1/00* (2006.01)

(52) U.S. Cl.
CPC ........ *B81B 3/0021* (2013.01); *B81C 1/00182* (2013.01); *B81B 2201/0235* (2013.01); *B81B 2207/053* (2013.01)

(58) Field of Classification Search
None
See application file for complete search history.

(56) References Cited

U.S. PATENT DOCUMENTS

| 3,448,098 A | 6/1969 | Gaines |
| 3,469,982 A | 9/1969 | Celeste |

(Continued)

FOREIGN PATENT DOCUMENTS

| EP | 1245528 | 10/2002 |
| EP | 2230679 | 9/2010 |

(Continued)

OTHER PUBLICATIONS

Almanza-Workman, "Planarization coating for polyimide substrates used in roll-to-roll fabrication of active matrix backplanes for flexible displays", Proceedings of SPIE, 2012, vol. 8323, pp. 83231K-1-83231K-11.

(Continued)

*Primary Examiner* — Abul Kalam
(74) *Attorney, Agent, or Firm* — Clifton F. Richardson

(57) ABSTRACT

A flexible film including one or more MEMS elements and articles including the flexible film are described. The flexible film includes a polymer layer between two metal layers with one of the metal layers containing a perforation. The polymer layer includes voided regions that allow for relative movement of the two metal layers.

16 Claims, 13 Drawing Sheets

(56) References Cited

U.S. PATENT DOCUMENTS

| | | | |
|---|---|---|---|
| 3,526,504 | A | 9/1970 | Celeste |
| 3,867,153 | A | 2/1975 | MacLachlan |
| 4,975,312 | A | 12/1990 | Lusignea |
| 5,055,416 | A | 10/1991 | Weber |
| 5,970,315 | A | 10/1999 | Carley |
| 6,071,819 | A | 6/2000 | Tai |
| 6,845,670 | B1 | 1/2005 | McNeil |
| 6,953,982 | B1 | 10/2005 | Tai |
| 6,967,362 | B2 | 11/2005 | Nam |
| 7,151,057 | B2 | 12/2006 | Nam |
| 7,202,101 | B2 | 4/2007 | Gabriel |
| 7,318,349 | B2 | 1/2008 | Vaganov |
| 7,361,523 | B2 | 4/2008 | Sooriakumar |
| 7,934,423 | B2 | 5/2011 | Nasiri |
| 8,205,498 | B2 | 7/2012 | Hsu |
| 8,333,113 | B2 | 12/2012 | Classen |
| 8,333,465 | B2 | 12/2012 | Byun |
| 8,368,154 | B2 | 2/2013 | Trusov |
| 8,372,677 | B2 | 2/2013 | Mehregany |
| 8,486,593 | B2 | 7/2013 | Haase |
| 2004/0258885 | A1 | 12/2004 | Kreutter |
| 2005/0000932 | A1* | 1/2005 | Gabriel ............... B81C 1/00158 216/2 |
| 2007/0120089 | A1 | 5/2007 | Mao |
| 2007/0155051 | A1* | 7/2007 | Wang ................. B81C 1/00047 438/107 |
| 2009/0067115 | A1* | 3/2009 | Arslan .................... H01G 5/18 361/281 |
| 2009/0299216 | A1* | 12/2009 | Chen ........................ A61B 3/16 600/561 |
| 2012/0032286 | A1 | 2/2012 | Trusov |
| 2012/0135237 | A1 | 5/2012 | Gracias |
| 2013/0207031 | A1 | 8/2013 | Palaniswamy |
| 2014/0296687 | A1* | 10/2014 | Irazoqui ................... A61B 3/16 600/398 |

FOREIGN PATENT DOCUMENTS

| | | |
|---|---|---|
| WO | WO 2008-030284 | 3/2008 |
| WO | WO 2008-030960 | 3/2008 |
| WO | WO 2010-075012 | 7/2010 |
| WO | WO 2011-060188 | 5/2011 |
| WO | WO 2014-035486 | 3/2014 |

OTHER PUBLICATIONS

Analog Devices, ADXL312 3-Axis Digital Accelerometer datasheet, 2010, 32pgs.

Azad, "Release of MEMS devices with hard-baked polyimide sacrificial layer", Proceedings of SPIE, 2013, vol. 8682, pp. 868226-1-868226-5.

Chen, "A Generalized Foundry CMOS Platform for Capacitively—Ransduced Resonators Monolithically Integrated With Amplifiers", MEMS II, Feb. 2012, 27pgs.

Crea, "Development of Gait Segmentation Methods for Wearable Foot Pressure Sensors", 2012 Annual International Conference of the IEEE Engineering in Medicine and Biology Society. IEEE, 2012, pp. 5018-5021.

Luo, "A Post-CMOS Micromachined Lateral Accelerometer" Journal of Microelectromechanical Systems, Jun. 2002, vol. 11, No. 3, pp. 188-195.

Ma, "Study of Polyimide as Sacrificial Layer with O2 Plasma Releasing for Its Application in MEMS Capacitive FPA Fabrication", Electronic Packaging Technology & High Density Packaging, IEEE, 2009, pp. 526-529.

Mrad, Advances in Health Monitoring and Management, 2011, pp. 109-136.

Oguchi, "Feasibility of Assessing Rehabilitation Status by using Foot Pressure Sensor While Walking", Defense Science Research Conference and Expo (DSR), IEEE, 2011, 4pgs.

Palasagaram, "MEMS-Capacitive Pressure Sensor Fabricated Using Printed-Circuit-Processing Techniques", IEEE Sensors Journal, Dec. 2006, vol. 6, No. 6, pp. 1374-1375.

Ramadoss, Design, Modelling, and Characterization of RF MEMS Capacitive Switches Based on Flexible Printed Circuit Technology, 1998, 174 pgs.

Rogers, "Design, Fabrication, and Dynamic Modeling of a Printed Circuit Based MEMS Accelerometer", May 10, 2007, 76 pgs.

Sabut, "Design of an insole embedded foot pressure sensor controlled FES system for foot drop in stroke patients", Systems in Medicine and Biology, 2010 International Conference on. IEEE, 2010, pp. 237-241.

Schoebel, "Design Considerations and Technology Assessment of Phased-Array Antenna Systems With RF MEMS for Automotive Radar Applications", IEEE Transactions on Microwave Theory and Techniques, Jun. 2005, vol. 53, No. 6, pp. 1968-1975.

Subbaraman, "Towards Roll-to-Roll Manufacturing of Polymer Photonic Devices", Proceedings of SPIE, 2014, vol. 8991, pp. 899116-1-899116-7.

Takahashi, "High-speed Pressure Sensor Grid for Humanoid Robot Foot", 2005 IEEE/RSJ International Conference on Intelligent Robots and Systems. IEEE, 2005, 6pgs.

Transducers, The 17$^{th}$ International Conference on Solid-State Sensors, Actuators and Microsystems, 2013, 89 pgs.

Vit, Research and development activities in printed intelligence, 2008, 52 pgs.

Wahab, "Micro-sensor for foot pressure measurement", TENCON 2008 IEEE Region 10 Conference, IEEE, 2008, 5 pgs.

Yazdi, "A Low Power Generic Interface Circuit for Capacitive Sensors", 1996, 4pgs.

International Search Report for PCT International Application No. PCT/US2015/030158, dated Jul. 22, 2015, 3pgs.

* cited by examiner

MEMS DEVICES ON FLEXIBLE SUBSTRATE

BACKGROUND

Micro electrical mechanical systems (MEMS) are traditionally made on silicon wafers or other rigid substrates using batch processes. The number of MEMS elements than can be made at one time is limited by the size of the silicon wafer. The size limitation and the need for batch processing adversely affect the cost effectiveness of traditional MEMS processing. In addition, the existence of the rigid substrate limits the applicability of existing MEMS devices. Accordingly, a need exists for MEMS devices that can be made in a continuous process and that do not require a rigid substrate.

SUMMARY

In at least one aspect, the present description provides a flexible film that includes a first metallic layer having a first outer major surface and a first inner major surface, a first polymer layer adjacent to the first metallic layer with the first inner major surface facing the first polymer layer, a second metallic layer having a second outer major surface and a second inner major surface with the second metallic layer positioned adjacent to the first polymer layer opposite the first metallic layer with the second inner major surface facing the first polymer layer. The flexible film includes one or more MEMS elements. Each MEMS element includes a first metallic region in the first metallic layer, a first voided region in the first polymer layer, and a second metallic region in the second metallic layer. The first metallic region includes a first perforation and the second metallic region includes a portion that is capable of a movement relative to the first metallic region.

In some embodiments, the first voided region is aligned with the first perforation such that a first continuous open region extends between the first outer major surface of the first metallic layer to the second inner major surface of the second metallic layer. In some embodiments, the second metallic region includes a pattern aligned with the first voided region such that the first continuous open region extends between the first outer major surface of the first metallic layer to the second outer major surface of the second metallic layer. In some embodiments, the first perforation includes at least one hole. In some embodiments, the first perforation includes 1 to about 100 holes and each hole has a diameter between about 30 microns and about 200 microns. In some embodiments, each MEMS element further includes one or more vias extending from the second metallic layer to the first metallic layer. In some embodiments, each MEMS element is selected from the group consisting of a spring resonator, a serpentine resonator, a fixed-guided-fixed resonator, a cantilever beam, a clamped membrane and an inter-digitated comb-drive resonator. In some embodiments, the first polymer layer includes polyimide, polycarbonate, polyethylene terephthalate, benzocyclobutene polymer, liquid crystal polymer or polydimethylsiloxane. In some embodiments, one or both of the first metallic layer and the second metallic layer includes copper, nickel, chromium, titanium, aluminum, gold, silver, beryllium and alloys thereof.

In some embodiments, the flexible film also includes a second polymer layer adjacent to the second metallic layer opposite the first polymer layer and a third metallic layer having a third outer major surface and a third inner major surface where the third metallic layer is positioned adjacent to the second polymer layer opposite the second metallic layer with the third inner major surface facing the second polymer layer. Each MEMS element may further include a second voided region in the second polymer layer and a third metallic region in the third metallic layer where the third metallic region includes a second perforation. In some embodiments, the second voided region is aligned with the second perforation such that a second continuous open region extends between the third outer major surface of the third metallic layer to the second outer major surface of the second metallic layer.

In some embodiments, the movement of the portion of the second metallic region that is capable of a movement relative to the first metallic region is in a direction substantially normal to the second outer major surface. In other embodiments, the movement is substantially in a plane containing the second outer major surface.

In some embodiments, the one or more MEMS elements is a plurality of MEMS elements. In some embodiments, the film has at least one dimension greater than about 100 millimeters. In some embodiments, a roll of the flexible film is provided.

In some embodiments, the first outer major surface is either a first free standing surface or is immediately adjacent a first outer polymeric layer or a first adhesive layer and the second outer major surface is either a second free standing surface or is immediately adjacent a second outer polymeric layer or a second adhesive layer.

In some embodiments, the first polymer layer has a thickness greater than about 0.5 microns and less than about 100 microns. In some embodiments, the thickness of the first polymer layer is greater than about 10 microns and less than about 100 microns.

Some embodiments of the present description include an article that has a surface with the flexible film conformably attached to the surface.

In at least one aspect, the present description provides an article including a three-dimensional object having a non-planar surface and a continuous film conformably attached to the non-planar surface. The continuous film includes a polymer layer and one or more MEMS elements. Each MEMS element includes a first metallic layer having a first outer major surface and a first inner major surface where the first metallic layer is disposed adjacent the polymer layer with the first inner major surface facing the polymer layer, a first voided region in the polymer layer, and a second metallic layer having a second outer major surface and a second inner major surface with the second metallic layer positioned adjacent to the polymer layer opposite the first metallic layer with the second inner major surface facing the polymer layer. The first metallic layer includes a first perforation. The first voided region is aligned with the first perforation such that a continuous open region extends between the first outer major surface of the first metallic layer to the second inner major surface of the second metallic layer. A portion of the second metallic layer is capable of a movement relative to the first metallic layer.

In some embodiments, the second metallic layer includes a pattern aligned with the first voided region such that the continuous open region extends between the first outer major surface of the first metallic layer to the second outer major surface of the second metallic layer. In some embodiments, the three-dimensional object is a glove, a shoe, a helmet, a prosthetic device or a robotic structure. In some embodiments, the three-dimensional object is a parallelepiped and the one or more MEMS elements includes a plurality of MEMS accelerometers where each MEMS accelerometer is attached to a distinct face of the parallelepiped. In some embodiments, the parallelepiped is a cube and the plurality of MEMS accelerometers includes three to six MEMS accelerometers.

DETAILED DESCRIPTION

Figure 1:
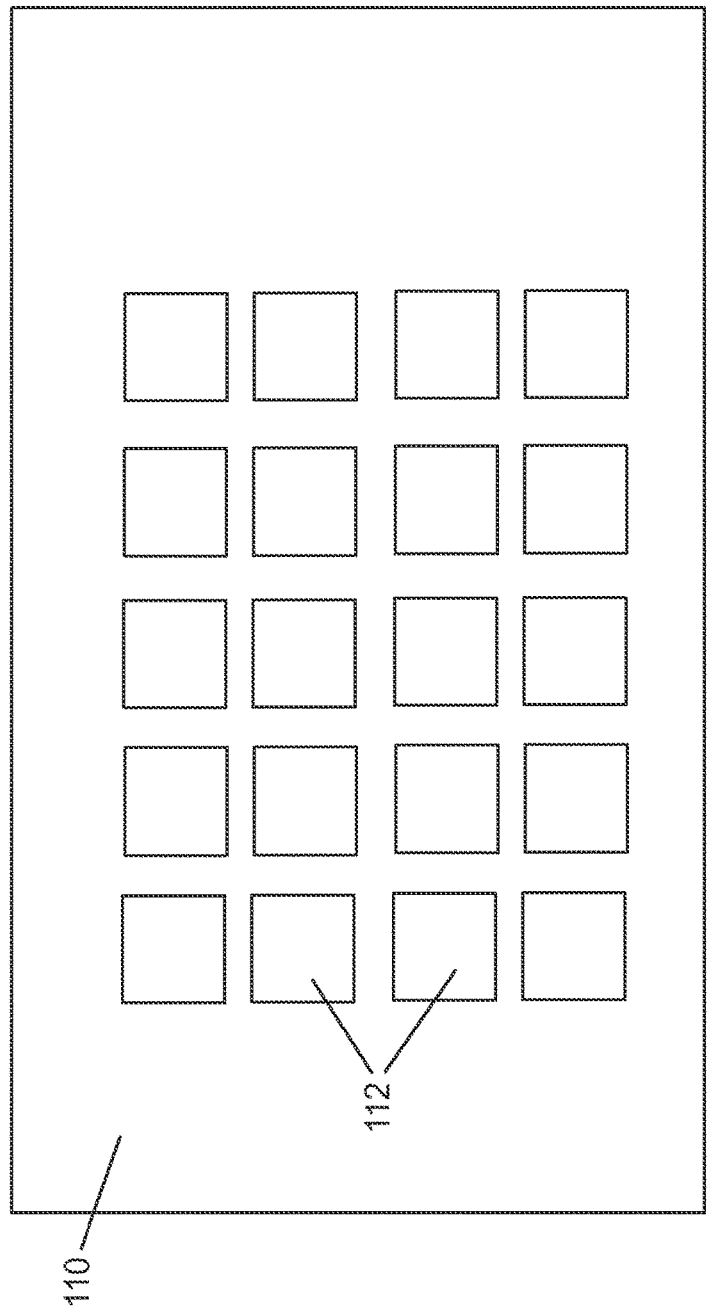
FIG. 1 is a schematic top view of a flexible film with a plurality of MEMS elements.

In the following description, reference is made to the accompanying set of drawings that form a part of the description hereof and in which are shown by way of illustration several specific embodiments. The figures are not necessarily to scale. In general similar reference numbers are used for similar features in the various embodiments. Unless indicated otherwise, these similar features may include the same materials, have the same attributes, and serve the same or similar functions. Additional or optional features described for one embodiment may also be additional or optional features for other embodiments, even if not explicitly stated, where appropriate. It is to be understood that other embodiments are contemplated and may be made without departing from the scope or spirit of the present description. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Unless otherwise indicated, the terms "coat," "coating," "coated," and the like are not limited to a particular type of application method such as spray coating, dip coating, flood coating, etc., and may refer to a material deposited by any method suitable for the material described, including deposition methods such vapor deposition methods, plating methods, coating methods, etc.

As used herein, layers, components, or elements may be described as being adjacent one another. Layers, components, or elements can be adjacent one another by being in direct contact, by being connected through one or more other components, or by being held next to one another or attached to one another. Layers, components, or elements that are in direct contact may be described as being immediately adjacent.

MEMS devices are conventionally made on rigid substrates such as silicon, glass, or ceramic wafers using batch processing techniques. It has been difficult to make MEMS elements integrated in an array larger than a few tens of millimeters because of constraints with the batch processing technology that has traditionally been used. An additional limitation of the traditional approach is the rigidity of the substrate. It is sometimes desirable to attach MEMS devices to a curved surface of an article or to a flexible article and this is difficult with traditional MEMS devices due to the rigid substrate. The present description provides for a flexible film containing MEMS devices that can be made in a continuous roll-to-roll process. The flexible film can have a length dimension greater than what can be achieved in traditional MEMS processing. For example, a flexible film having a length dimension greater than 100 millimeters, or greater than about 500 millimeters, or greater than about 1 meter, or greater than about 10 meters can be made with MEMS elements integrated into the film substantially over the length of the film. The resulting film is flexible enough that sections of the film can be cut out and conformably attached to articles allowing MEMS-based devices to be made that cannot be made in other ways.

In the present description, MEMS devices are fabricated into a film having a polymer layer with metal layers on each surface of the polymer layer. The polymer layer acts as both a sacrificial layer in forming the MEMS devices and as a carrier layer that holds the MEMS devices together.

FIG. 1 shows flexible film 110 containing a plurality of MEMS elements 112. In some embodiments, MEMS elements 112 are arranged in a periodic array as shown in FIG. 1. In other embodiments, other arrangements are possible. In some embodiments, the MEMS elements are arranged in a regular, periodic, random, pseudo-random or other pattern. In some embodiments, the MEMS elements are arranged in a periodic pattern in a first direction but arranged in a random or pseudo-random or other regular or irregular pattern in a second direction.

Figure 2:
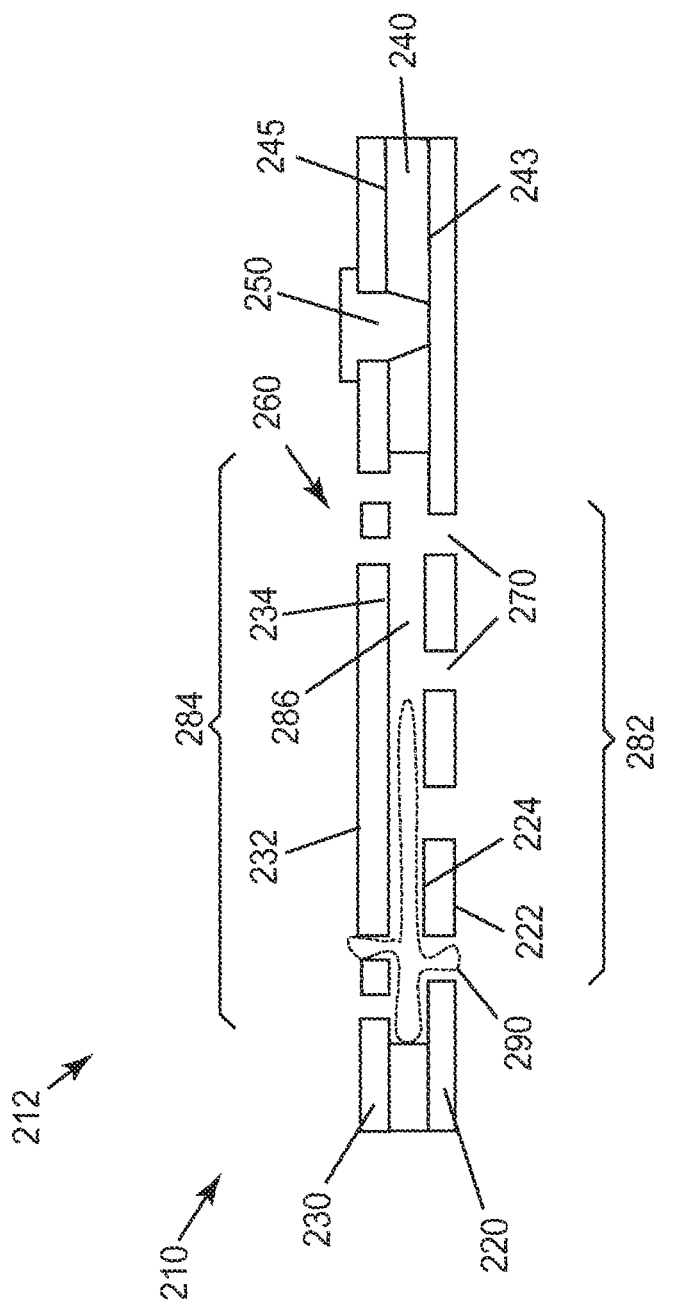
FIG. 2 is a schematic side view of a portion of a flexible film including a MEMS element.

FIG. 2 shows a portion of a flexible film 210 that includes an individual MEMS element 212. Flexible film 210 includes a first metallic layer 220 having a first outer major surface 222 and a first inner major surface 224, a second metallic layer 230 having a second outer major surface 232 and a second inner major surface 234, a first polymer layer 240 having a first polymer major surface 243 adjacent the first inner major surface 224 and a second polymer major surface 245 adjacent the second inner major surface 234. Flexible film 210 further includes via 250, a pattern 260 in second metallic layer 230, a first perforation 270 in first metallic layer 220, a first metallic region 282 in first metallic layer 220, a second metallic region 284 in second metallic layer 230, a first voided region 286 in first polymer layer 240, and a first continuous open region 290. First polymer layer 240 is adjacent the first metallic layer 220 with the first inner major surface 224 facing the first polymer layer 240 and the second metallic layer 230 is disposed adjacent to the first polymer layer 240 opposite the first metallic layer 220 with the second inner major surface 234 facing the first polymer layer 240.

The first voided region 286 is aligned with the first perforation 270 such that a first continuous open region 290 extends between the first outer major surface 222 of the first metallic layer 220 to the second inner major surface 234 of the second metallic layer. In the embodiment shown in FIG. 2, the second metallic region 284 includes a pattern 260 aligned with the first voided region 286 such that the first continuous open region 290 extends between the first outer major surface 222 of the first metallic layer 220 to the second outer major surface 232 of the second metallic layer 230.

Figure 3A:
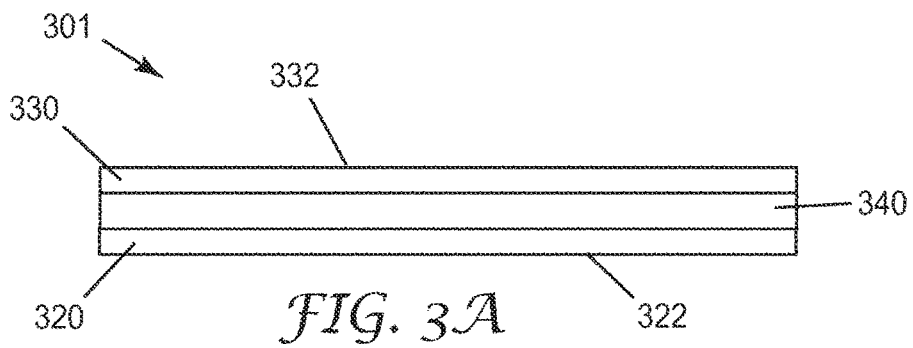
FIG. 3A is a schematic side view of an un-patterned film.

Flexible film incorporating MEMS devices according to the present description can be prepared as illustrated in FIGS. 3A-3D. FIG. 3A shows un-patterned film 301 which includes first metallic layer 320 corresponding to first metallic layer 220, second metallic layer 330 corresponding to second metallic layer 230, and first polymer layer 340 corresponding to first polymer layer 240. First metallic layer 320 has first outer major surface 322 and second metallic layer 330 has second outer major surface 332. Un-patterned film 301 can be made by depositing or otherwise attaching a first metallic layer 320 and a second metallic layer 330 to first polymer layer 340. In some embodiments, the metallic layers are prepared by sputtering a metal coating onto each side of first polymer layer 340 and then electroplating each metal coating to a desired thickness. Suitable thicknesses for each metallic layer may be in the range of about 3 microns to about 50 microns. Alternatively, polymeric films having metallic layers on each side are commercially available. For example, UPISEL N from Ube Industries, Japan is a polyimide polymer layer commercially available with copper foil on each surface of the polyimide layer.

Figure 3B:
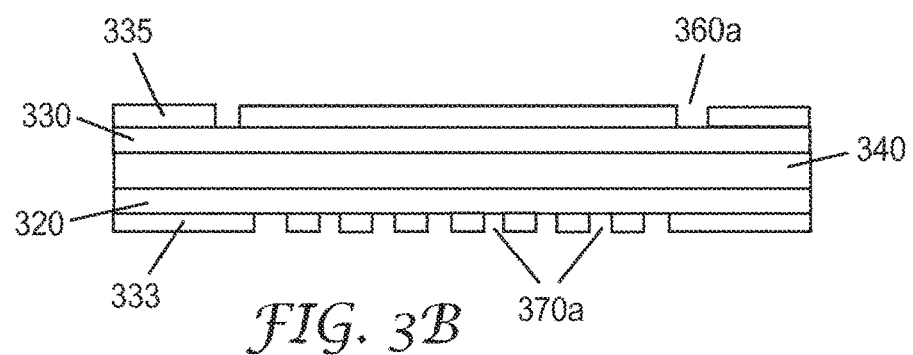
FIG. 3B is a schematic side view of the un-patterned film of FIG. 3A with attached masks.

FIG. 3B shows a first mask 333 attached to first metallic layer 320 and a second mask 335 attached to second metallic layer 330. Second mask 335 contains a mask pattern 360a and first mask 333 contains a mask perforation 370a.

Suitable masks include photoresists or hard masks such as metal masks. Suitable photoresists include negative acting, aqueous developable, photopolymer compositions such as those disclosed in U.S. Pat. Nos. 3,469,982; 3,448,098; 3,867,153; and 3,526,504. Such photoresists include at least a polymer matrix including crosslinkable monomers and a photoinitiator. Polymers typically used in photoresists include copolymers of methyl methacrylate, ethyl acrylate and acrylic acid, copolymers of styrene and maleic anhydride isobutyl ester and the like. Crosslinkable monomers may be multiacrylates such as trimethylol propane triacrylate.

Commercially available aqueous base (e.g., sodium carbonate) developable, negative acting photoresists that may be employed according to the present description include polymethylmethacrylates photoresist materials such as those available under the trade name RISTON from E.I. duPont de Nemours and Co., e.g., RISTON 4720. Other useful examples include AP850 available from LeaRonal, Inc., Freeport, N.Y., and PHOTEC HU350 available from Hitachi Chemical Co. Ltd. Useful alternatives include dry film photoresist compositions available under the trade name AQUA MER from MacDermid, Waterbury, Conn. There are several series of suitable AQUA MER photoresists including the "SF" and "CF" series with SF120, SF125, and CF2.0 being representative of these materials.

Aqueous processable photoresists may be laminated over both sides of un-patterned film 301 using standard laminating techniques. The thickness of the photoresist may be in the range from about 10 microns to about 50 microns. Upon exposure of the photoresist on both sides of the laminate to actinic radiation (e.g., ultraviolet light or the like) through a mask, the exposed portions of the photoresist become insoluble by crosslinking. The resist is then developed by removal of unexposed polymer with a dilute aqueous solution, e.g., a 0.5-1.5% sodium carbonate solution, until desired mask pattern 360a and mask perforation 370a are obtained.

Figure 3C:
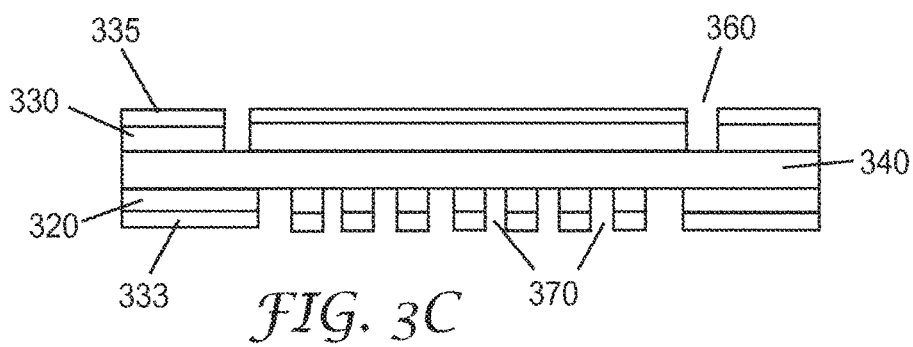
FIG. 3C is a schematic side view of the film of FIG. 3B where areas of outer metal layers have been etched.

FIG. 3C show pattern 360 in second metallic layer 330 and perforation 370 in first metallic layer 320. Pattern 360 and perforation 370 can be formed by etching the metallic layers using any etchant that does not significantly compromise the polymer layer when used in a roll-to-roll etching process. Suitable etchants include etchants based on hydrogen peroxide and sulfuric acid such as PERMA ETCH, available from Electrochemicals, Inc (Maple Plain, Minn.), etchants based on ferric chloride, etchants based on hydrofluoric acid or mixtures of hydrofluoric acid and nitric acid, etchants based on phosphoric acid, acetic acid and nitric acid, and etchants based on aqua regia (nitro-hydrochloric acid), or any etchant chemistries capable of reducing the solid metal to an ionic metal species.

An alternative to etching out the desired patterns or perforations in the metallic layers, is to electroplate metallic layers having the desired pattern or perforation directly. This can be done by first sputtering metallic layers on both surfaces of first polymer layer 340 then electroplating to produce a desired thickness in each metallic layer. A suitable thickness is about 1-5 microns. Next a photoresist or hard mask such as a metal mask is applied to each metallic layer and the desired pattern or perforation is exposed into each photoresist such that regions where metal is to be located is not exposed. The resist is then developed and the unexposed resist removed as described elsewhere. Metal is then electroplated onto both exposed surfaces to a desired thickness which may be in the range of about 3 microns to about 50 microns. The photoresists are then removed leaving the thicker metal regions where desired and thinner metal in the pattern and perforation areas that can be removed by a separate etching step.

Figure 3D:
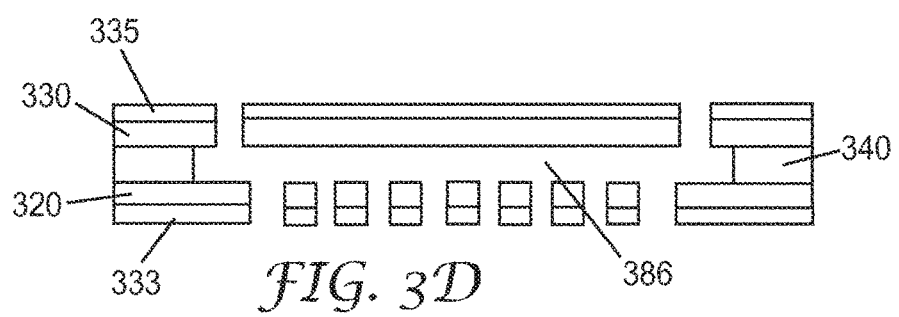
FIG. 3D is a schematic side vie of the film of FIG. 3C where a region of a polymer layer has been etched.

FIG. 3D shows first voided region 386 in first polymer layer 340. First voided region 386 can be formed using a polymer etching process. Any suitable etchant may be used and may vary depending on the polymer material. Suitable etchants may include alkali metal salts, e.g. potassium hydroxide; alkali metal salts with one or both of solubilizers, e.g., amines, and alcohols, such as ethylene glycol. Suitable chemical etchants for some embodiments of the present description include KOH/ethanol amine/ethylene glycol etchants such as those described in more detail in U.S. Patent Application Publication No. 2007/0120089 (Mao et al.), which is hereby incorporated herein by reference in its entirety. Other suitable etchant chemistries are the KOH/glycine, and KOH/glycine/ethylene diamine chemistries described in more detail in U.S. Patent Application Publication No. 2013/0207031 (Palaniswamy), which is hereby incorporated herein by reference in its entirety. The KOH/glycine etchant provides a slow, controlled etching. The etching rate can be increased by adding ethylene diamine to the etchant formulation. The polymer may be etched at a temperature in the range of about 50° C. to about 120° C. In some cases a gas phase etchant is used. For example, the polymer may be etched in a reactive ion etching process using $O_2$ and $SF_6$ plasma or using $O_2$ and $CF_4$ plasma. Other etchant chemistries known in the semiconductor manufacturing industry may also be used.

After etching the polymer layer, the mask layers 333 and 335 are then stripped from both sides of the laminate. When photoresists are used as the mask layers, the photoresists may be removed using a 2-5% solution of an alkali metal hydroxide in a temperature range of about 25° C. to about 80° C.

One or more vias, such as via 250 shown in FIG. 2, can be included in the flexible film by including a pattern for the vias in second mask 335, etching second metallic layer 330 in the region of the vias, etching first polymer layer 340 in the region of the vias, and then metalizing the etched region using standard metallization techniques to produce the vias.

All of the process steps illustrated in FIGS. 3A-3D can be carried out in a continuous roll-to-roll process using standard continuous web processing techniques. The continuous process may be carried out in automated fashion using equipment designed to transport a web material through the process sequence from a supply roll to a wind-up roll, which collects mass produced flexible film that includes MEMS elements. The processing equipment may include a web handling device that has a variety of processing stations for applying, exposing and developing photoresist coatings, as well as etching and/or plating the metallic layers and etching the polymer film. Etching stations may include a number of spray bars with jet nozzles that spray etchant on the moving web to etch those parts of the web not protected by cross-linked photoresist. Additional suitable roll-to-roll processes are described in U.S. Pat. No. 5,055,416 (Weber) and U.S. Pat. No. 8,486,593 (Haase et al.), for example. The process described in the present description takes advantage of the simultaneous use of the polymeric web as the core substrate material onto which MEMS elements are fabricated and as the sacrificial material that when removed from localized regions, releases the free moving structures from the fixed structures of a MEMS device or MEMS sensor.

Figure 4A:
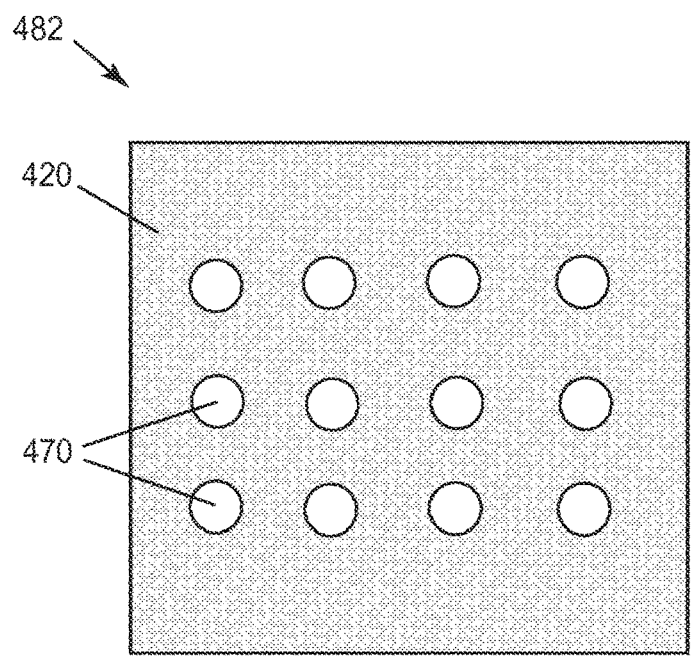
FIG. 4A is a schematic top view of a region of a metallic layer.

FIG. 4A shows a first metallic region 482 of first metallic layer 420. First metallic region 482 includes perforation 470. First metallic layer 420, which corresponds to first metallic layer 220, is one layer of a flexible film of the present description. In some embodiments, perforation 470 includes at least one hole as shown in FIG. 4A. In some embodiments, perforation 470 includes 1 to about 100 holes. The number and size of the holes may be chosen so that the polymer layer can be effectively etched. Each hole diameter may be greater than about 0.4 microns, or greater than about 1 micron, or greater than about 10 microns or greater than about 30 microns and each hole diameter may be smaller than about 100 microns or smaller than about 150 microns, or smaller than about 200 microns. For example, in some embodiments, each hole has a diameter between about 30 microns and about 200 microns. Typically, a larger number of smaller holes are chosen when gas phase etching is used and a smaller number of larger holes are used with liquid phase etching. The upper size of the hole is limited by the size of the MEMS device. Each MEMS device may have a size (e.g., length or width in the plane of the MEMS device) greater than about 1 micron or greater than about 10 microns and less than about 5 m or less than about 1 mm.

Figure 4B:
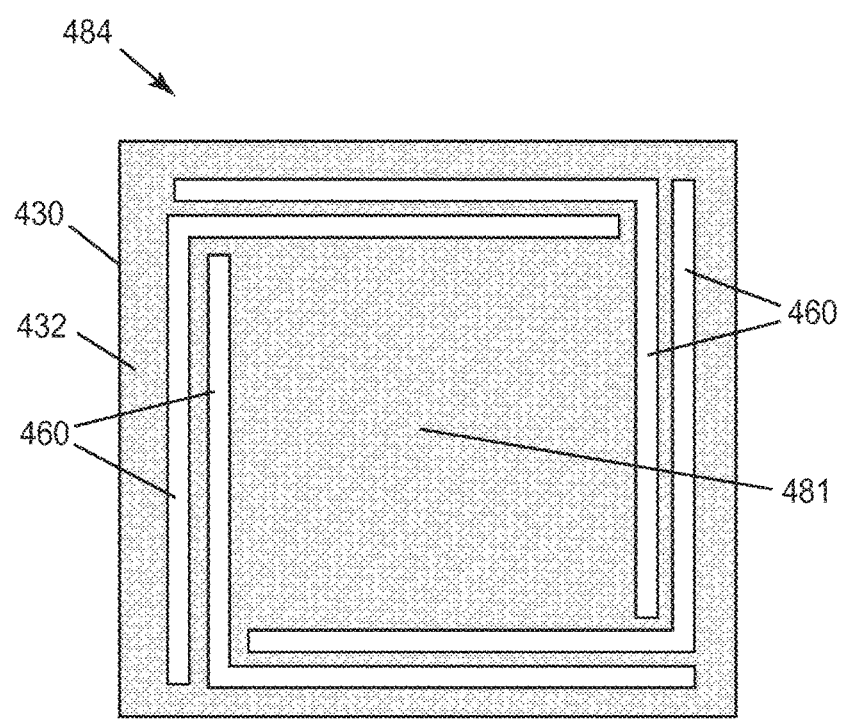
FIG. 4B is a schematic top view of a region of a metallic layer.

FIG. 4B shows a second metallic region 484 of second metallic layer 430 having second outer major surface 432. Second metallic region 484 includes pattern 460 and a movable portion 481. Second metallic layer 430, which corresponds to second metallic layer 230, is one layer of a flexible film of the present description. The flexible film also includes a first metallic layer 420 shown in FIG. 4A corresponding to first metallic layer 220. Movable portion 481 is capable of moment relative to the first metallic layer 420. In the embodiment shown in FIG. 4B, the movement of movable portion 481 is substantially normal to second outer major surface 432 (i.e., into or out of the plane of FIG. 4B). In other embodiments, other types of movement are possible.

Figure 4C:
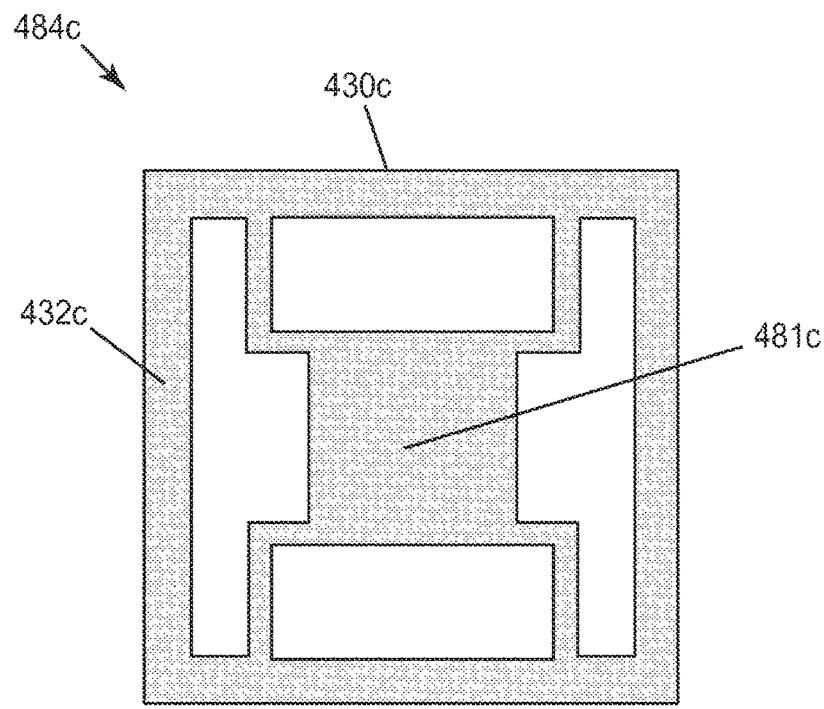
FIG. 4C is a schematic top view of a region of a metallic layer.
Figure 4D:
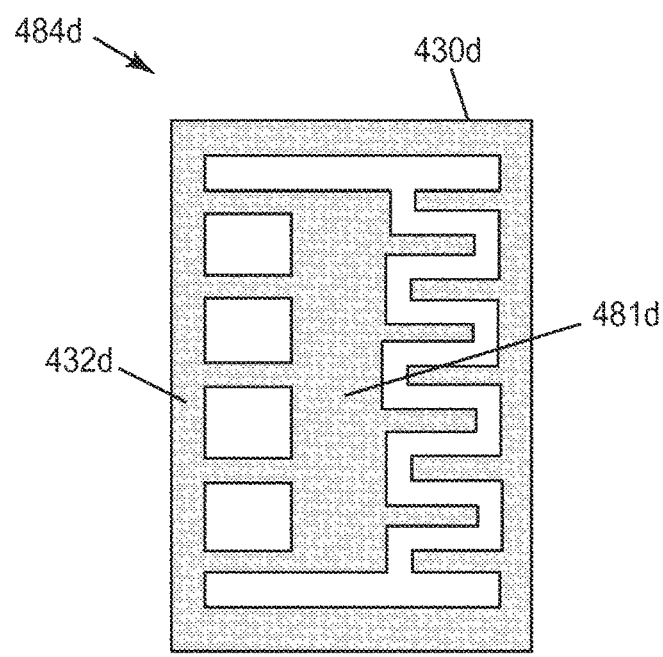
FIG. 4D is a schematic top view of a region of a metallic layer.

Any type of MEMS device that can be made into parallel metal layers may be included in the flexible film of the present description. The MEMS device resulting from second metallic region 484 of FIG. 4B is an example of a spring resonator. FIG. 4C shows an alternate second metallic region 484c of second metallic layer 430c having second outer major surface 432c. The MEMS device resulting from second metallic region 484c is an example of a crab-leg resonator which is a type of spring resonator. Movable portion 481c is capable of movement in a direction substantially normal to second outer major surface 432c. FIG. 4D shows an alternate second metallic region 484d of second metallic layer 430d having second outer major surface 432d. The MEMS device resulting from second metallic region 484d is an example of an inter-digitated comb-drive resonator. Movable portion 481d is capable of movement substantially in a plane containing second outer major surface 432d (i.e., in the plane of FIG. 4D).

Figure 4E:
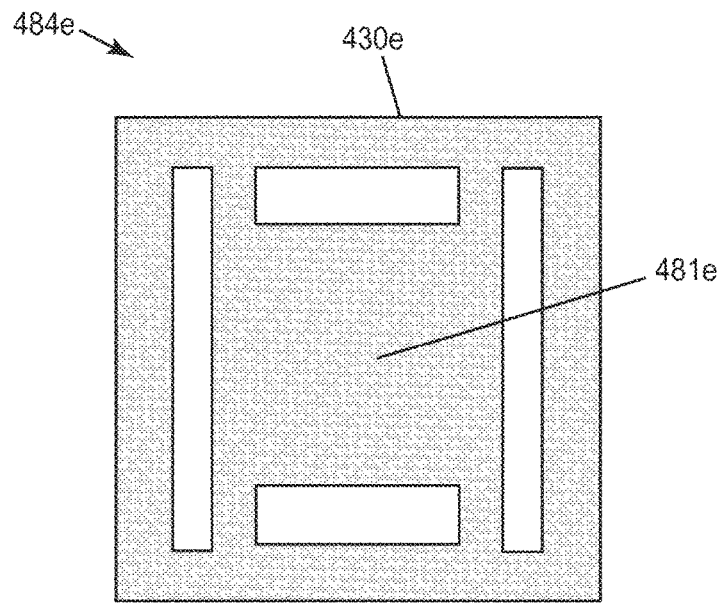
FIG. 4E is a schematic top view of a region of a metallic layer.
Figure 4F:
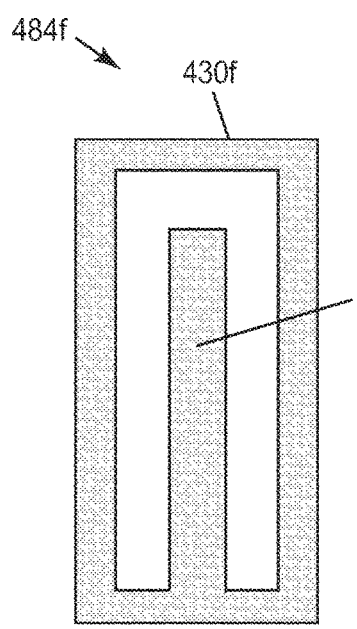
FIG. 4F is a schematic top view of a region of a metallic layer.
Figure 4G:
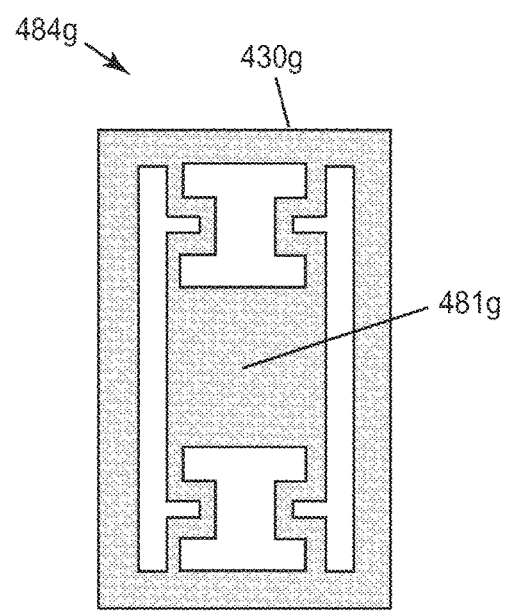
FIG. 4G is a schematic top view of a region of a metallic layer.

Other possible types of MEMS devices include fixed-guided-fixed resonators, cantilever beams and serpentine resonators. Referring to FIG. 4E, a fixed-guided-fixed resonator can be made using second metallic region 484e of second metallic layer 430e having movable portion 481e. Referring to FIG. 4F, a cantilever beam device can be made using second metallic region 484f of second metallic layer 430f having movable portion 481f. Referring to FIG. 4G, a serpentine resonator can be made using second metallic region 484g of second metallic layer 430g having movable portion 481g. Another possible MEMS device is a clamped membrane or clamped diaphragm device which is made by simply not etching a pattern into the second metallic layer. In this case the voided region in the first polymer layer allows movement of a metallic region of the second metallic layer adjacent the voided region by deflection of the metallic region. This type of MEMS device can be useful as a pressure sensor, for example. In some embodiments, the flexible film contains an array of one type of MEMS device. In other embodiments, the flexible film includes multiple types of MEMS devices.

The MEMS devices may be sensors or actuators and may be used as pressure sensors, touch sensors, impact sensors, accelerometers, microphones, and the like. For example, in some embodiments the MEMS devices may be accelerometers and may be used for impact sensing or for vibration sensing. In other embodiments, the MEMS devices may be pressure sensors and may be used to determine pressure distribution. In other embodiments, the MEMS devices may be microphones and a film containing MEMS microphones can provide a conformable microphone array.

Figure 10:
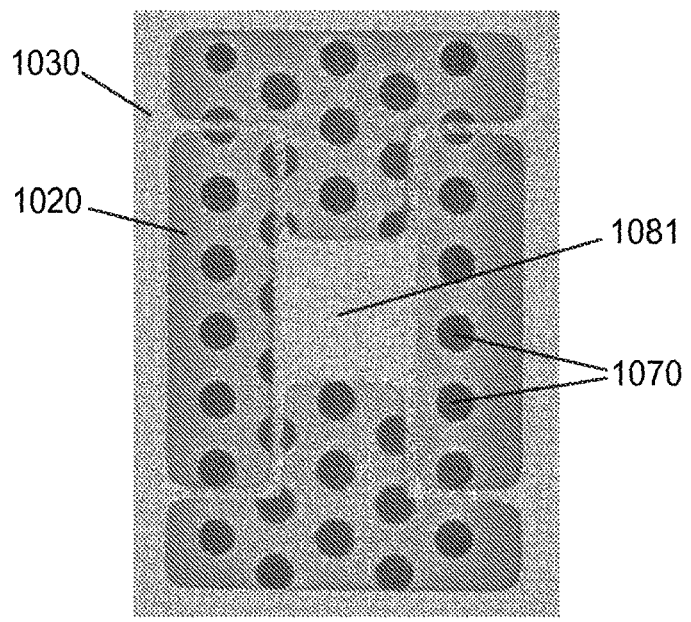
FIGS. 10-16 are images of MEMS elements.
Figure 11:
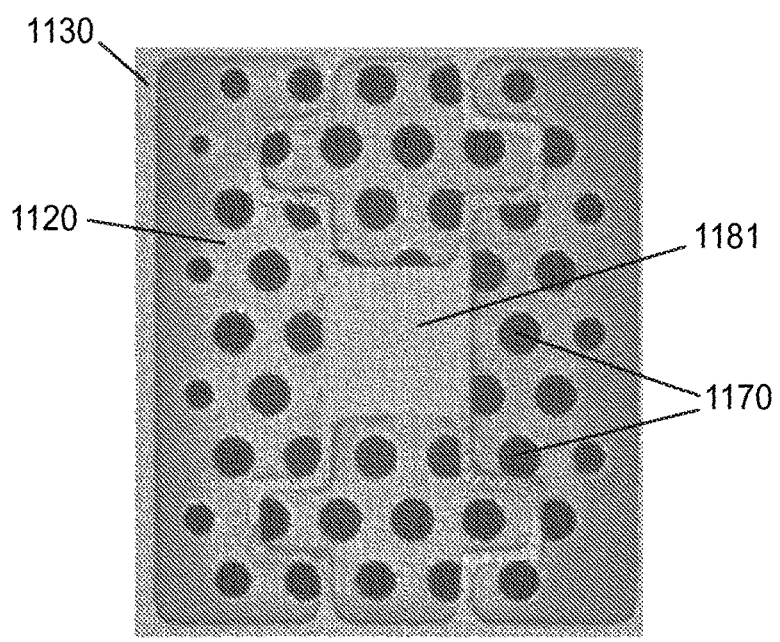
Figure 12:
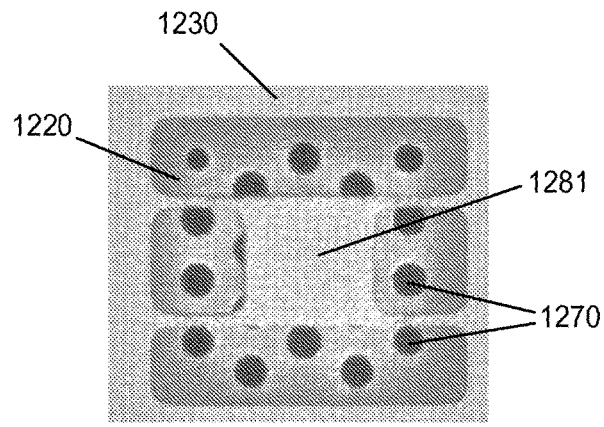
Figure 13:
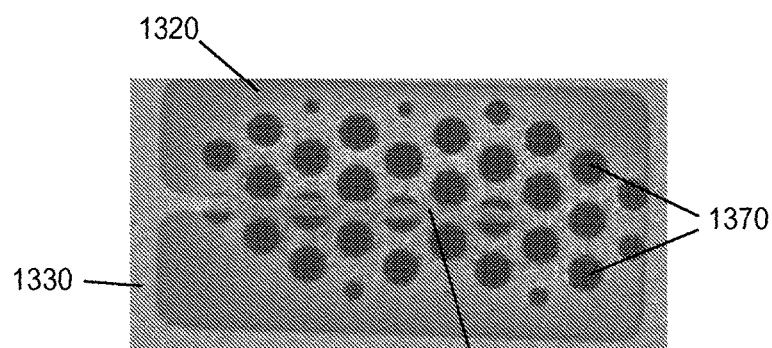
Figure 14:
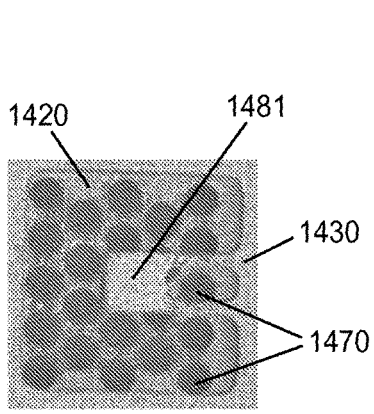
Figure 15:
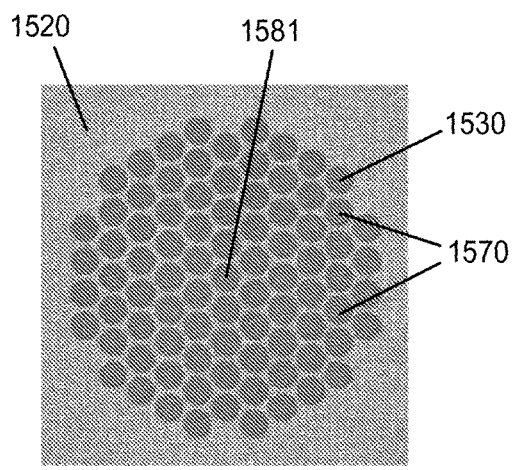

Images of MEMS elements made using the continuous web processing techniques described previously are shown in FIGS. 10-15. The dimensions of the MEMS elements are in a range of about 0.5 mm to about 2.5 mm. FIG. 10 shows a crab-leg resonator having second metallic layer 1030, which includes movable portion 1081, facing out of the plane of the figure. First metallic layer 1020, which includes perforation 1070, is visible through etched portions of second metallic layer 1030. FIG. 11 shows a serpentine spring resonator with second metallic layer 1130, which includes movable portion 1181, facing out of the plane of the figure. First metallic layer 1120, which includes perforation 1170, is visible through etched portions of second metallic layer 1130. FIG. 12 shows a fixed-guided-fixed resonator with second metallic layer 1230, which includes movable portion 1281, facing out of the plane of the figure. First metallic layer 1220, which includes perforation 1270, is visible through etched portions of second metallic layer 1230. FIG. 13 shows a cantilever beam resonator with second metallic layer 1330, which includes movable portion 1381, facing out of the plane of the figure. First metallic layer 1320, which includes perforation 1370, is visible through etched portions of second metallic layer 1330. FIG. 14 shows a resonator with second metallic layer 1430, which includes movable portion 1481, facing out of the plane of the figure. First metallic layer 1420, which includes perforation 1470, is visible through etched portions of second metallic layer 1430. FIG. 15 shows a clamped membrane resonator with first metallic layer 1520, which includes perforation 1570, facing out of the plane of the figure. Second metallic layer 1530, which includes movable portion 1581, is visible through perforation 1570. The holes visible in FIGS. 10-15 have a diameter of about 150 microns. The spring elements that connect the movable portion of the second metallic layer to the remaining portion of portion of the second metallic layer in these examples have a width of about 75 microns. The dimensions of the movable portions (resonators) in FIGS. 10-12 are about 600 microns by 600 microns.

Figure 16:
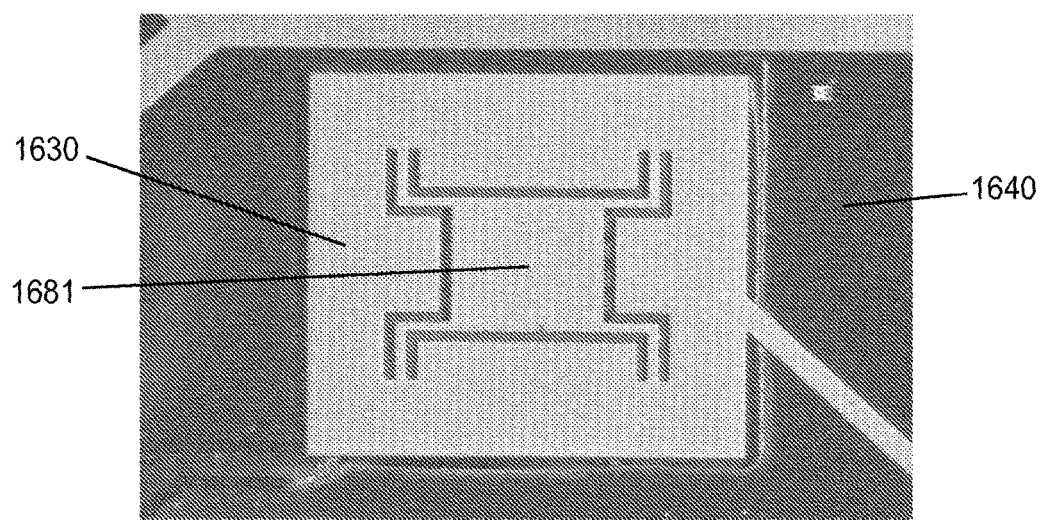

In the embodiments shown in FIGS. 10-14, a relatively large amount of metal has been removed from the second metal layer near the movable portions (resonators). In other embodiments, less metal is removed from the vicinity of the resonator (movable portion). By limiting the amount of metal removed to relatively localized regions near the resonator, the yield can be improved since such localized regions can be more efficiently etched. An example of this is illustrated in FIG. 16 which shows a crab-leg spring resonator with second metallic layer 1630 facing out of the plane of the figure. Second metallic layer 1630 includes movable portion 1681. First polymer layer 1640 is visible where second metallic layer 1630 has been removed. The dimensions of movable portion 1681 in FIG. 16 are about 500 microns by 600 microns.

Figure 5:
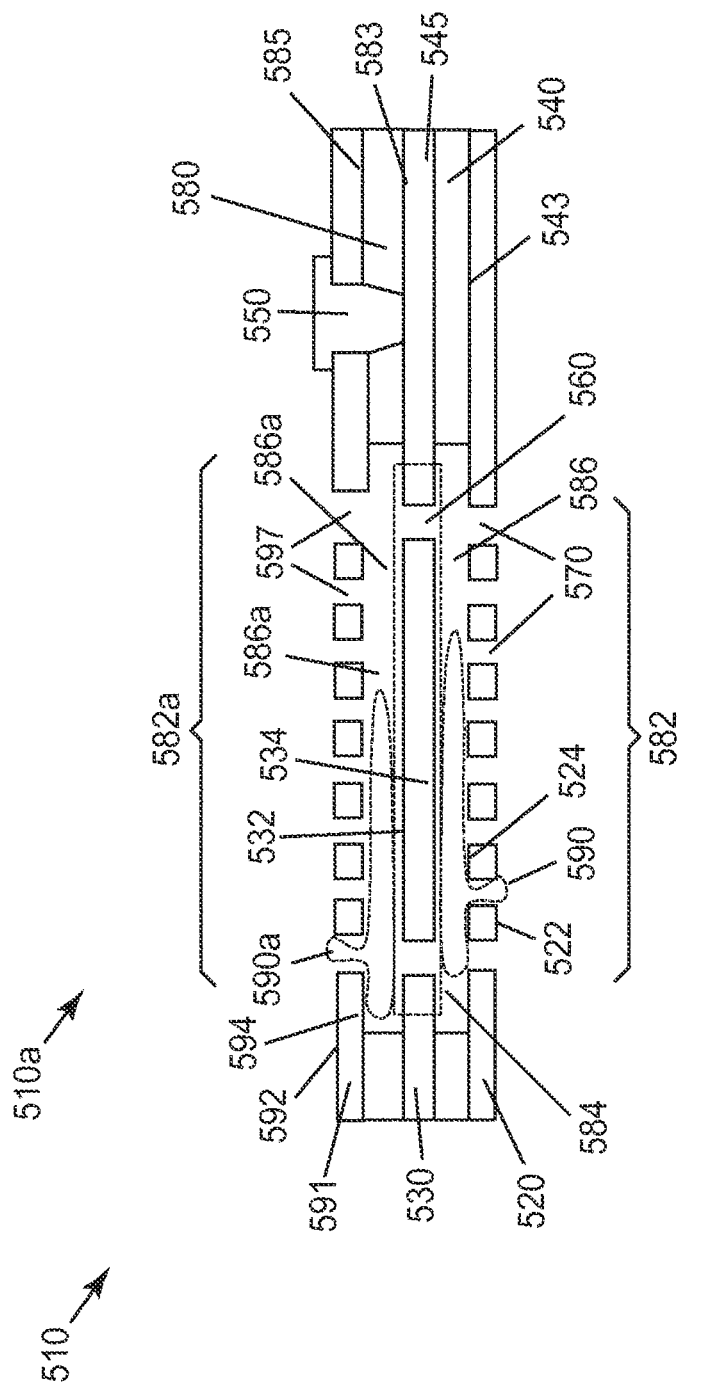
FIG. 5 is a schematic side view of a portion of a flexible film including a MEMS element.

In some cases it may be desired to have a symmetrical MEMS device where the movable portion of a metallic layer is near the center of a film stack. FIG. 5 shows a portion of a flexible film 510 that includes an individual MEMS element 510*a*. Flexible film 510 includes a first metallic layer 520 having a first outer major surface 522 and a first inner major surface 524, a second metallic layer 530 having a second outer major surface 532 and a second inner major surface 534, a first polymer layer 540 having a first polymer major surface 543 adjacent the first inner major surface 524 and a second polymer major surface 545 adjacent the second inner major surface 534. Flexible film 510 also includes a second polymer layer 580 having a third polymer major surface 583 and a fourth polymer major surface 585 and a third metallic layer 591 having third outer major surface 592 and third inner major surface 594. Flexible film 510 further includes via 550, a pattern 560 in second metallic layer 530, a first perforation 570 in first metallic layer 520, a first metallic region 582 in first metallic layer 520, a second metallic region 584 in second metallic layer 530, a third metallic region 582*a* in third metallic layer 591, a first voided region 586 in first polymer layer 540, a second voided region 586*a* in second polymer layer 580, a first continuous open region 590, a second continuous open region 590*a*, and a second perforation 597.

First polymer layer 540 is adjacent the first metallic layer 520 with the first inner major surface 524 facing the first polymer layer 540 and the second metallic layer 530 is disposed adjacent to the first polymer layer 540 opposite the first metallic layer 520 with the second inner major surface 534 facing the first polymer layer 540. Second polymer layer 580 is disposed adjacent the second metallic layer 530 opposite the first polymer layer 540. The third metallic layer 591 is disposed adjacent the second polymer layer 580 opposite the second metallic layer 530 with the third inner major surface 594 facing the second polymer layer 580.

The first voided region 586 is aligned with the first perforation 570 such that a first continuous open region 590 extends between the first outer major surface 522 of the first metallic layer 520 to the second inner major surface 534 of the second metallic layer 530. Similarly, the second voided region 586*a* is aligned with the second perforation 597 such that a second continuous open region 590*a* extends between the third outer major surface 592 of the third metallic layer 591 to the second outer major surface 532 of the second metallic layer 530. In the embodiment shown in FIG. 5, pattern 560 is such that first continuous open region 590 and second continuous open region 590*a* form a continuous open region extending between first outer major surface 522 and third outer major surface 592. Flexible film 510 may be made by first making a flexible film as described elsewhere having a first polymer layer 540 with a first metallic layer 520 and a second metallic layer 530 having a pattern 560. Then a second polymer layer 580 may be laminated using standard lamination techniques to the second metallic layer 530. A third metallic layer 591 may then be deposited on the second polymer layer 580 opposite the second metallic layer 530 or alternatively the second polymer layer 580 may have the third metallic layer 591 attached prior to lamination of the second polymer layer 580 to the patterned second metallic layer 530. Second perforation 597 may be made in third metallic layer 591 using the techniques described elsewhere for producing first perforation 570. Second voided region 586*a* can then be made in second polymer layer 580 using the techniques described elsewhere for producing first voided region 586.

Suitable polymeric materials for use in polymer layers of the flexible films of the present description include polyesters, polycarbonates, liquid crystal polymers, polyimides, benzocyclobutene polymer, polydimethylsiloxane and polyethylene terephthalate (PET). Suitable polyimides include those available under the trade names KAPTON, available from DuPont (Wilmington, Del.); APICAL, available from Kaneka Corporation (Otsu, Japan); SKC Kolon PI, available from SKC Kolon PI Inc (Korea); and UPILEX and UPISEL including UPILEX S, UPILEX SN, and UPISEL VT, all available from Ube Industries (Japan). These UPILEX and UPISEL polyimides are made from monomers such as biphenyl tetracarboxylic dianhydride (BPDA) and phenyl diamine (PDA).

Polymer layers thinner than about 1 micron may be difficult to handle in a roll-to-roll process. In many embodiments of the present description the polymer layers have a thickness greater than about 1 micron. Polymer layers thicker than about 200 microns may result in a stiffness in the flexible films that may be too high for some applications. In addition, etching such thick polymer films may be difficult or time consuming. In some embodiments, the thickness of the polymer layer is greater than about 0.5 microns, or greater than about 1 micron, or greater than about 2 microns, or greater than about 5 microns, or greater than about 10 microns and less than about 200 microns, or less than about 100 microns or less than about 50 microns.

In some embodiments, polyimide film is used as a polymer layer. Many commercially available polyimide films include monomers of pyromellitic dianhydride (PMDA), or oxydianiline (ODA), or biphenyl dianhydride (BPDA), or phenylene diamine (PDA). Polyimide film products believed to be made using one or more of these monomers are designated under the trade name KAPTON H, K, E films (DuPont, Wilmington, Del.) and APICAL AV, NP films (Kaneka Corporation, Japan).

Another suitable polyimide film is APICAL HPNF polyimide film (Kaneka Corporation, Japan), which is believed to be a copolymer that derives its ester unit containing structure from polymerizing of monomers including p-phenylene bis(trimellitic acid monoester anhydride). To one of ordinary skill in the art, it would be reasonable to synthesize other ester unit containing polyimide polymers depending upon selection of monomers similar to those used for APICAL HPNF. Such syntheses could expand the range of polyimide polymers for films, which, like APICAL HPNF, may be controllably etched. Materials that may be selected to increase the number of ester containing polyimide polymers include 1,3-diphenol bis(anhydro-trimellitate), 1,4-diphenol bis(anhydro-trimellitate), ethylene glycol bis(anhydro-trimellitate), biphenol bis(anhydro-trimellitate), oxydiphenol bis(anhydro-trimellitate), bis(4-hydroxyphenyl sulfide) bis(anhydro-trimellitate), bis(4-hydroxybenzophenone) bis(anhydro-trimellitate), bis(4-hydroxyphenyl sulfone) bis(anhydro-trimellitate), bis(hydroxyphenoxybenzene), bis(anhydro-trimellitate), 1,3-diphenol bis(aminobenzoate), 1,4-diphenol bis(aminobenzoate), ethylene glycol bis(aminobenzoate), biphenol bis(aminobenzoate), oxy-diphenol bis(aminobenzoate), bis(4 aminobenzoate) bis(aminobenzoate), and the like.

Liquid crystal polymers (LCP) may also be used as a polymer layer. Suitable films of liquid crystal polymers include aromatic polyesters including copolymers containing p-phenyleneterephthalamide such as BIAC film (Japan Gore-Tex Inc., Okayama-Ken, Japan) and copolymers containing p-hydroxybenzoic acid such as LCP CT film (Kuraray Co., Ltd., Okayama, Japan). Suitable films also include ESPANEX films (Nippon Steel & Sumikin Chemical Co. Ltd).

Other suitable films include extruded and tentered (biaxially stretched) liquid crystal polymer films. For example, a process described in U.S. Pat. No. 4,975,312 provided multiaxially (e.g., biaxially) oriented thermotropic polymer films of commercially available liquid crystal polymers (LCP) identified by the trade names VECTRA (naphthalene based, available from Hoechst Celanese Corp.) and XYDAR (biphenol based, available from Amoco Performance Products).

Polycarbonate film may also be used as a polymer layer. Examples of suitable polycarbonate materials include substituted and unsubstituted polycarbonates; polycarbonate blends such as polycarbonate/aliphatic polyester blends, including the blends available under the trade name XYLEX from GE Plastics, Pittsfield, Mass., polycarbonate/polyethyleneterephthalate (PC/PET) blends, polycarbonate/polybutyleneterephthalate (PC/PBT) blends, and polycarbonate/poly(ethylene 2,6-naphthalate) ((PPC/PBT, PC/PEN) blends, and any other blend of polycarbonate with a thermoplastic resin; and polycarbonate copolymers such as polycarbonate/polyethyleneterephthalate (PC/PET) and polycarbonate/polyetherimide (PC/PEI).

Another type of polymeric material suitable for use in the present description is a laminate such as a polycarbonate laminate or a PET laminate. Such a laminate may have at least two different polymeric layers adjacent to each other or may have at least one polycarbonate layer adjacent to a thermoplastic material layer (e.g., LEXAN GS 125DL which is a polycarbonate/polyvinylidene fluoride (PVDF) laminate from GE Plastics). Polymeric materials may also be filled with carbon black, silica, alumina and the like or they may contain additives such as flame retardants, UV stabilizers, pigments and the like. Polymeric materials may include microparticles or nanoparticles for application specific constructions or for modifying the material properties for enhanced performance, increased reliability or durability.

Any polymeric material for which any etchant provides a desirable etch rate and desirable result may be used for any polymer layer of the present description. Examples of other suitable polymers include polyamide-imides and polyesters such as amorphous PET, polyethylene naphthalate (PEN), polybutylene terephthalate (PBT) and the like.

Suitable metals for use in any metal layer of the present description include any metal that can be chemically etched. Examples include copper, nickel, chromium, titanium, silver, aluminum, gold, beryllium and alloys thereof, such as beryllium-copper alloy.

Since the flexible films of the present description can be made in continuous roll-to-roll processes, larger length scales can be achieved compared to conventional silicon wafer fabrication techniques. In some embodiments, the flexible film has a length greater than about 100 millimeters, 500 millimeters, or greater than about 1 m, or greater than about 3 m, or greater than about 10 m, or even greater than about 30 m. In some embodiments the flexible film has a length scale in the range of about 1 m to about 500 m. In some embodiments, the flexible film contains at least $10^4$ MEMS devices or at least $10^6$ MEMS devices or at least $10^9$ MEMS devices. In some embodiments, the flexible film contains at least $10^4$ MEMS devices or at least $10^6$ MEMS elements or at least $10^9$ MEMS elements and contains less than $10^{15}$ MEMS elements or less than less than $10^{20}$ MEMS elements. In some embodiments, one or more MEMS elements are fabricated at one or more locations specific to an end application. In some embodiments, a roll of the flexible film is provided. In some embodiments, a flexible film may be singulated so that flexible films having only one MEMS element or having 1 to about 10 or 1 to about 100 MEMS elements are produced.

In some embodiments, the first outer major surface is a free standing surface. In other embodiments, a first coating may be applied to the first outer major surface. The first coating may be a first outer polymeric layer or a first adhesive layer. A first outer polymeric layer may be used as a protective layer. Similarly, in some embodiments, second outer major is a free standing surface, while in other embodiments a second coating may be applied to second outer major surface. The second coating may be a second outer polymeric layer or a second adhesive layer. A second outer polymeric layer may be used as a protective layer. An adhesive layer can be applied to either the first outer major surface or the second outer major surface in order to conformably attach the film to a surface of an article. For example, an array of MEMS accelerometers or MEMS microphones may be conformably attached to a surface of an article.

Figure 6:
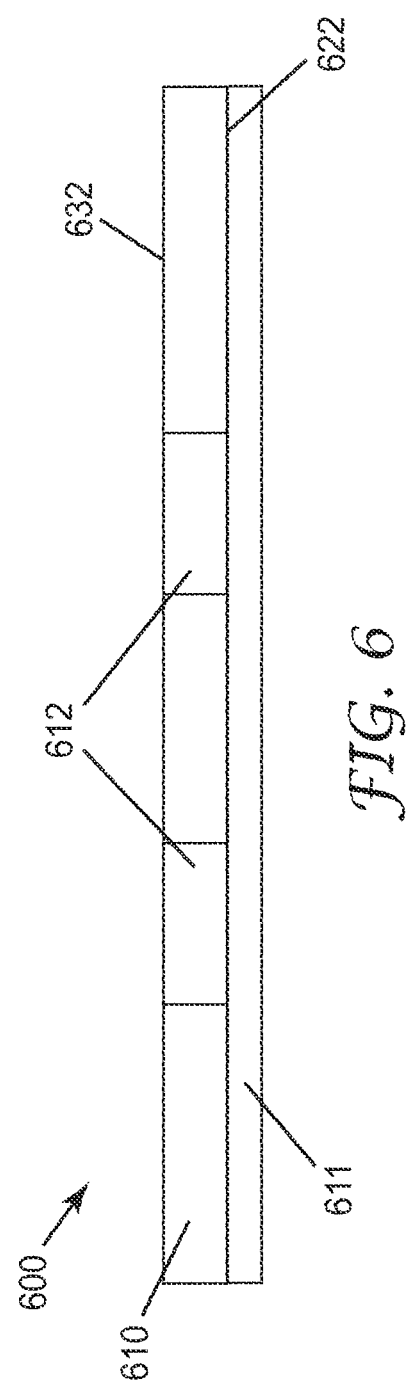
FIG. 6 is a schematic side view of a flexible film including MEMS elements.

FIG. 6 shows flexible film 600 that includes flexible film 610 and adhesive layer 611. Flexible film 610 includes MEMS elements 612 and has a first outer major surface 622 and a second outer major surface 632 which is a free standing surface. Adhesive layer 611 is attached to first outer major surface 622. Since neither first outer major surface 622 nor second outer major surface 632 is attached to silicon or other rigid substrates, flexible film 600 could not be obtained in conventional silicon wafer manufacturing processes where MEMS devices are made on a silicon substrate.

Figure 7:
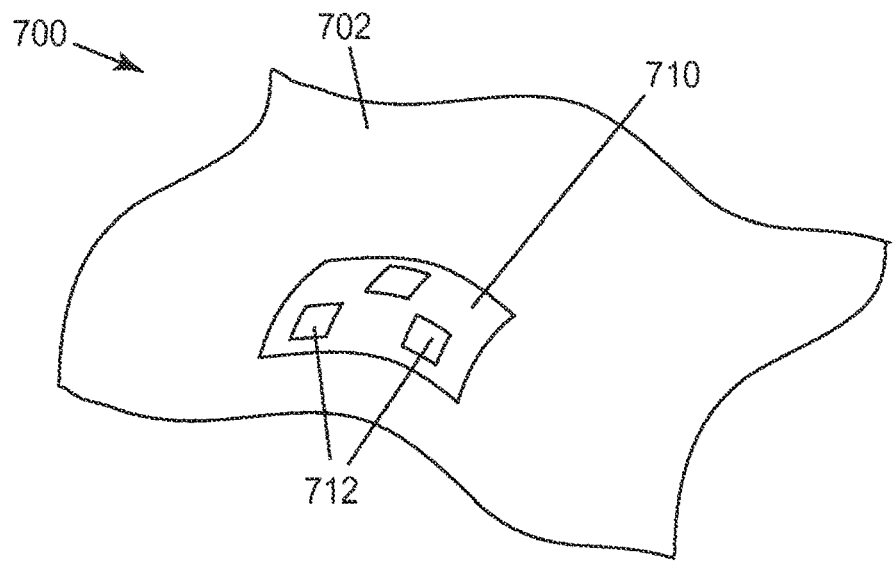
FIG. 7 is a schematic perspective view of a portion of an article having a flexible film including MEMS elements.

Having MEMS devices incorporated into a flexible film, allows integration with various articles more readily than conventional MEMS devices. FIG. 7 shows a portion 700 of an article having a surface 702. Flexible film 710, includes MEMS elements 712, is conformably attached to surface 702. Surface 702 may be substantially flat or it may be a non-planar surface.

In one aspect of the present description, an article includes a three-dimensional object having a non-planar surface. The non-planar surface may be a curved surface or it may consist of two or more planar surfaces joined together—for example, the surface of a cube. The non-planar surface may be non-planar when the article is in a first state but planar or approximately planar when the article is in a second state. This may be the case for a flexible article, for example, that has a surface which is non-planar when the article is subject to a stress, but is substantially planar when the article is un-stressed. For example, the non-planar surface may be a surface in a shoe sole which is curved when the shoe is flexed. The surface may be an exterior surface or the surface may be an embedded surface—for example, an interface between two layers. The article includes a flexible film conformably attached to the surface where the flexible film contains at least one MEMS element. Such a flexible film can be made by cutting out a portion of any of the flexible films of the present description described elsewhere, where the cut-out portion contains at least one MEMS element. This allows one or more MEMS elements to be integrated into an article as an integral part of a continuous film. Suitable articles include a glove, a helmet, a shoe, a prosthetic device or a robotic structure such as a robotic arm.

In some embodiments, a flexible film contains a plurality of MEMS-based pressure sensors. Such a film can be used in an article such as a shoe sole, for example, in order to collect data regarding the pressure distribution on the shoe as a wearer walks or runs. Such data could be useful in podiatry or in sports science. In some embodiments, the pressure sensors are electrically connected in common rows and columns for multiplex data transfer. In some embodiments, electrical traces which connect the pressure sensors together are formed by etching a suitable pattern in a metal layer of the flexible film—for example, in second metallic layer 230 of FIG. 2. In some embodiments, an article, such as a shoe, incorporating the flexible film includes a data storage unit for receiving and storing data from the pressure sensors. In some embodiments, the article may include a transmitter for receiving and transmitting data from the pressure sensors. In some embodiments, the article includes a circuit for conditioning the data from the pressure sensors.

In some embodiments, the article includes a battery or other power source for supplying power to the sensors and associated electronics. In some embodiments, a battery is integrated into the circuit using a printing or plating technique.

In some embodiments, a three-directional accelerometer is obtained by conformably attaching a flexible film having three or more MEMS accelerometers to a three-dimensional object. In some embodiments, the three-dimensional object is a parallelepiped and each MEMS accelerometer is attached to a distinct face of the parallelepiped. The parallelepiped may be a cube and the flexible film may include three to six MEMS accelerometers with each MEMS accelerometer attached to a distinct face of the cube. In some embodiments, a multi-axis (e.g, three or more axes) accelerometer system is obtained by conformably attaching a flexible film having a plurality of MEMS elements onto a flat or curved surface. Such an accelerometer system can be used for sensing acceleration about any arbitrary axis thereby allowing an angular impact response surface to be created.

Figure 9:
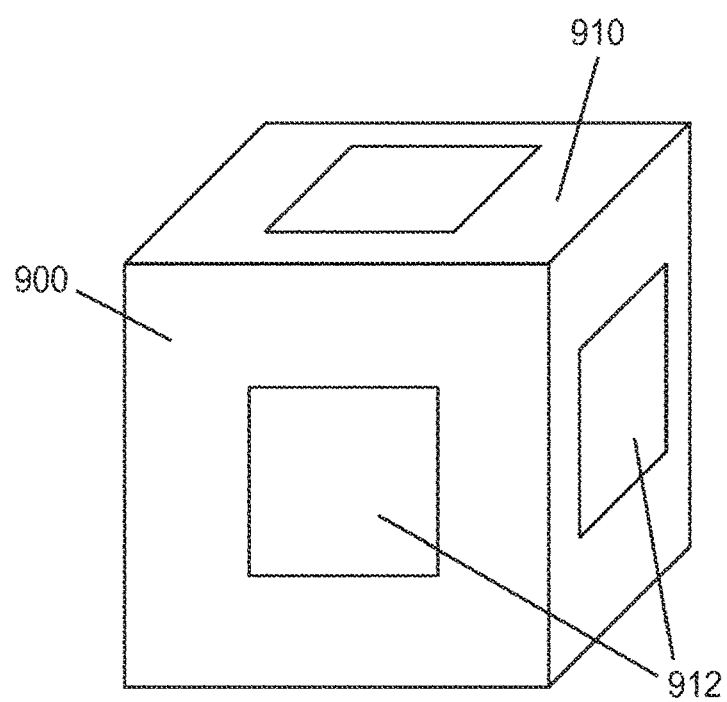
FIG. 9 is schematic perspective view of an accelerometer.
Figure 8:
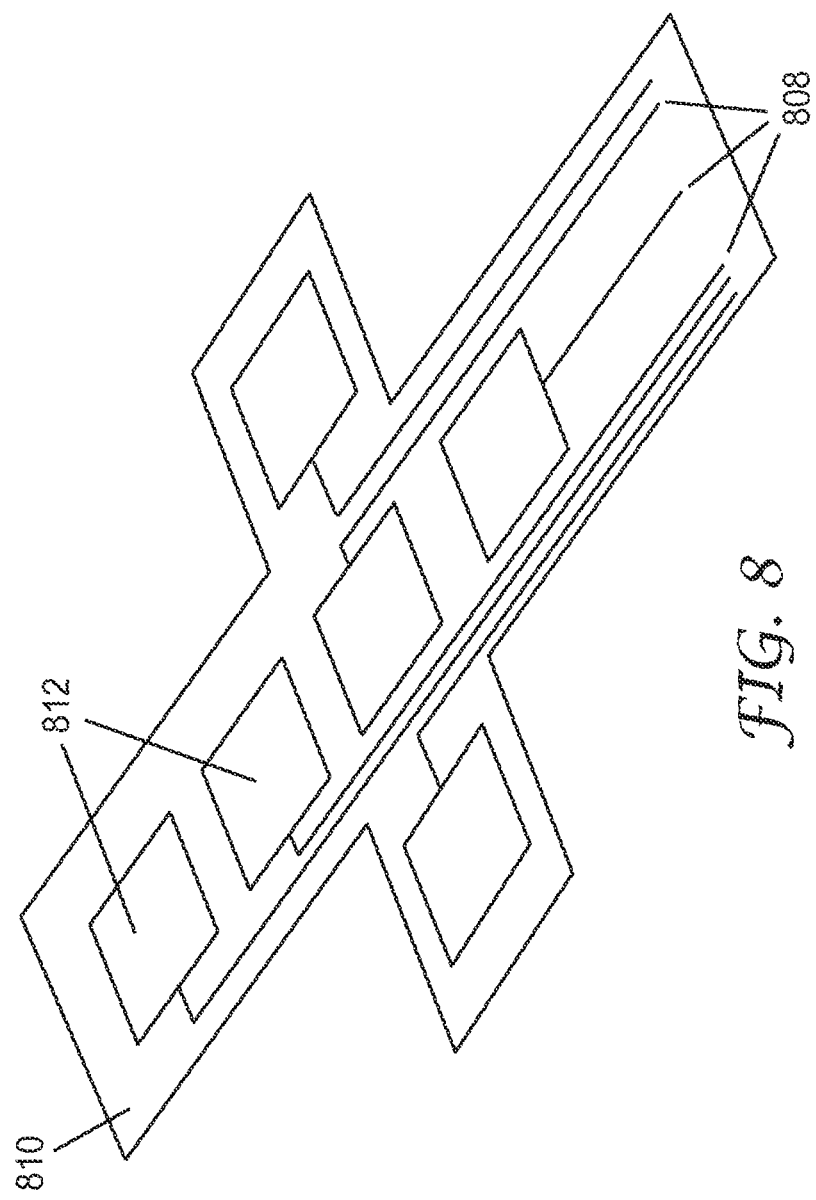
FIG. 8 is a schematic perspective view of a flexible film containing MEMS elements.

FIG. 8 shows flexible film 810 containing MEMS elements 812 and traces 808. Flexible film 810 can be prepared by cutting out a section from a larger flexible film containing MEMS elements. Traces 808 can be made by suitably etching a pattern in the first or second metallic layer of flexible film 810. Alternatively, traces 808 can be applied by using a printing process to deposit conductive material. FIG. 9 shows cube 900 with a flexible film 910 conformably attached to the cube 900. Flexible film 910, which corresponds to flexible film 810, includes MEMS elements 912. MEMS elements 912 may be MEMS accelerometers.

In some embodiments, a flexible film including MEMS accelerometers is attached to or integrated into an article for use as an impact sensor. For example, a flexible film including MEMS accelerometers can be attached to or integrated into a helmet for use as an impact sensor. In some embodiments, the article includes a circuit for signal conditioning, a power source such as a battery and a memory unit or a data transmittal unit. In some embodiments, the article includes LED force indicator lights that illuminate when a threshold force has been detected.

In some embodiments, a circuit or circuits are included in the flexible film. In some embodiments, the circuits include a radio frequency (RF) radio microchip, capable of receiving and sending MEMS sensor data. In some embodiments, the circuits include application specific firmware capable of managing and sending data to an Android® or iOS® application running on a mobile computing device, smart phone, or smart appliance.

The following is a list of exemplary embodiments of the present description:

Embodiment 1 is a flexible film, comprising:
  a first metallic layer having a first outer major surface and a first inner major surface;
  a first polymer layer adjacent the first metallic layer, the first inner major surface facing the first polymer layer;
  a second metallic layer having a second outer major surface and a second inner major surface, the second metallic layer disposed adjacent the first polymer layer opposite the first metallic layer, the second inner major surface facing the first polymer layer,
wherein the flexible film includes one or more MEMS elements, each MEMS element including:
  a first metallic region in the first metallic layer, the first metallic region including a first perforation;
  a first voided region in the first polymer layer; and a second metallic region in the second metallic layer, the second metallic region including a portion that is capable of a movement relative to the first metallic region.

Embodiment 2 is the flexible film of Embodiment 1, wherein the first voided region is aligned with the first perforation such that a first continuous open region extends between the first outer major surface of the first metallic layer to the second inner major surface of the second metallic layer.

Embodiment 3 is the flexible film of Embodiment 2, wherein the second metallic region includes a pattern aligned with the first voided region such that the first continuous open region extends between the first outer major surface of the first metallic layer to the second outer major surface of the second metallic layer.

Embodiment 4 is the flexible film of Embodiment 1, wherein the first perforation includes at least one hole.

Embodiment 5 is the flexible film of Embodiment 4, wherein the first perforation includes 1 to about 100 holes and each hole has a diameter between about 30 microns and about 200 microns.

Embodiment 6 is the flexible film of Embodiment 1, wherein each MEMS element further includes one or more vias extending from the second metallic layer to the first metallic layer.

Embodiment 7 is the flexible film of Embodiment 1, wherein each MEMS element is selected from the group consisting of a spring resonator, a serpentine resonator, a fixed-guided-fixed resonator, a cantilever beam, a clamped membrane and an inter-digitated comb-drive resonator.

Embodiment 8 is the flexible film of Embodiment 1, wherein the first polymer layer includes a polymer selected from the group consisting of polyimide, polycarbonate, polyethylene terephthalate, benzocyclobutene polymer, liquid crystal polymer and polydimethylsiloxane.

Embodiment 9 is the flexible film of Embodiment 1, wherein at least one of the first metallic layer and the second metallic layer includes a metal selected from the group consisting of copper, nickel, chromium, titanium, aluminum, gold, silver, beryllium and alloys thereof.

Embodiment 10 is the flexible film of Embodiment 1, further comprising:
a second polymer layer adjacent the second metallic layer opposite the first polymer layer;
a third metallic layer having a third outer major surface and a third inner major surface, the third metallic layer disposed adjacent the second polymer layer opposite the second metallic layer, the third inner major surface facing the second polymer layer;
wherein each MEMS element further includes:
a second voided region in the second polymer layer,
and a third metallic region in the third metallic layer, the third metallic region including a second perforation.

Embodiment 11 is the flexible film of Embodiment 10, wherein the second voided region is aligned with the second perforation such that a second continuous open region extends between the third outer major surface of the third metallic layer to the second outer major surface of the second metallic layer.

Embodiment 12 is the flexible film of Embodiment 1, wherein the movement is in a direction substantially normal to the second outer major surface.

Embodiment 13 is the flexible film of Embodiment 1, wherein the movement is substantially in a plane containing the second outer major surface.

Embodiment 14 is the flexible film of Embodiment 1, wherein the one or more MEMS elements is a plurality of MEMS elements.

Embodiment 15 is the flexible film of Embodiment 1, wherein the flexible film has at least one dimension greater than about 100 millimeters.

Embodiment 16 is a roll of the flexible film of Embodiment 1.

Embodiment 17 is the flexible film of Embodiment 1, wherein the first outer major surface is either a first free standing surface or is immediately adjacent a first outer polymeric layer or a first adhesive layer and the second outer major surface is either a second free standing surface or is immediately adjacent a second outer polymeric layer or a second adhesive layer.

Embodiment 18 is the flexible film of Embodiment 1, wherein the first polymer layer has a thickness greater than about 0.5 microns and less than about 100 microns.

Embodiment 19 is the flexible film of Embodiment 18, wherein the thickness is greater than about 10 microns.

Embodiment 20 is an article comprising a surface and the flexible film of Embodiment 1, wherein the flexible film is conformably attached to the surface.

Embodiment 21 is an article comprising:
a three-dimensional object having a non-planar surface; and
a continuous film conformably attached to the non-planar surface, the continuous film including a polymer layer and one or more MEMS elements, each of the one or more MEMS elements including:
a first metallic layer having a first outer major surface and a first inner major surface, the first metallic layer disposed adjacent the polymer layer, the first inner major surface facing the polymer layer, the first metallic layer including a first perforation;
a first voided region in the polymer layer;
a second metallic layer having a second outer major surface and a second inner major surface, the second metallic layer disposed adjacent the polymer layer opposite the first metallic layer, the second inner major surface facing the polymer layer,
wherein the first voided region is aligned with the first perforation such that a continuous open region extends between the first outer major surface of the first metallic layer to the second inner major surface of the second metallic layer and wherein a portion of the second metallic layer is capable of a movement relative to the first metallic layer.

Embodiment 22 is the article of Embodiment 21, wherein the second metallic layer includes a pattern aligned with the first voided region such that the continuous open region extends between the first outer major surface of the first metallic layer to the second outer major surface of the second metallic layer.

Embodiment 23 is the article of Embodiment 21, wherein the three-dimensional object is selected from the group consisting of a glove, a shoe, a helmet, a prosthetic device and a robotic structure.

Embodiment 24 is the article of Embodiment 21, wherein the three-dimensional object is a parallelepiped and the one or more MEMS elements includes a plurality of MEMS accelerometers, each MEMS accelerometer attached to a distinct face of the parallelepiped.

Embodiment 25 is the article of Embodiment 24, wherein the parallelepiped is a cube and the plurality of MEMS accelerometers includes three to six MEMS accelerometers.

Descriptions for elements in figures should be understood to apply equally to corresponding elements in other figures, unless indicated otherwise. The present invention should not be considered limited to the particular embodiments described above, as such embodiments are described in detail in order to facilitate explanation of various aspects of the invention. Rather, the present invention should be understood to cover all aspects of the invention, including various modifications, equivalent processes, and alternative devices falling within the scope of the invention as defined by the appended claims and their equivalents.

What is claimed is:

1. A flexible film, comprising:
one or more MEMS elements;
a first metallic layer having a first outer major surface and a first inner major surface;
a first polymer layer adjacent the first metallic layer, the first inner major surface facing the first polymer layer;
a second metallic layer having a second outer major surface and a second inner major surface, the second inner major surface facing the first polymer layer, the first polymer layer disposed between the first and second metallic layers,
wherein each MEMS element in the one or more MEMS elements includes:
a first metallic region in the first metallic layer, the first metallic region including a first perforation;
a first voided region in the first polymer layer, the first voided region extending continuously through a thickness of the first polymer layer; and
a second metallic region in the second metallic layer, the second metallic region including a portion that is capable of a movement relative to the first metallic region,
wherein the flexible film is sufficiently flexible that the flexible film can be wound into a roll of the flexible film.

2. The flexible film of claim 1, wherein the first voided region is aligned with the first perforation such that a first continuous open region extends between the first outer major surface of the first metallic layer to the second inner major surface of the second metallic layer.

3. The flexible film of claim 2, wherein the second metallic region includes a pattern aligned with the first voided region such that the first continuous open region extends between the first outer major surface of the first metallic layer to the second outer major surface of the second metallic layer.

4. The flexible film of claim 1, wherein the first perforation includes 1 to about 100 holes and each hole has a diameter between about 30 microns and about 200 microns.

5. The flexible film of claim 1, wherein each MEMS element further includes one or more vias extending from the second metallic layer to the first metallic layer.

6. The flexible film of claim 1, wherein each MEMS element is selected from the group consisting of a spring resonator, a serpentine resonator, a fixed-guided-fixed resonator, a cantilever beam, a clamped membrane and an inter-digitated comb-drive resonator.

7. The flexible film of claim 1, further comprising:
a second polymer layer adjacent the second metallic layer opposite the first polymer layer;
a third metallic layer having a third outer major surface and a third inner major surface, the third metallic layer disposed adjacent the second polymer layer opposite the second metallic layer, the third inner major surface facing the second polymer layer;
wherein each MEMS element further includes:
a second voided region in the second polymer layer, and a third metallic region in the third metallic layer, the third metallic region including a second perforation.

8. The flexible film of claim 7, wherein the second voided region is aligned with the second perforation such that a second continuous open region extends between the third outer major surface of the third metallic layer to the second outer major surface of the second metallic layer.

9. The flexible film of claim 1, wherein the movement is in a direction substantially normal to the second outer major surface.

10. The flexible film of claim 1, wherein the movement is substantially in a plane containing the second outer major surface.

11. The flexible film of claim 1, wherein the one or more MEMS elements is a plurality of MEMS elements.

12. The flexible film of claim 1, wherein the first outer major surface is either a first free standing surface or is immediately adjacent a first outer polymeric layer or a first adhesive layer and the second outer major surface is either a second free standing surface or is immediately adjacent a second outer polymeric layer or a second adhesive layer.

13. A roll of the flexible film of claim 1.

14. An article comprising a non-planar surface and a flexible film conformably attached to the non-planar surface, wherein the flexible film comprises:
one or more MEMS elements;
a first metallic layer having a first outer major surface and a first inner major surface;
a first polymer layer adjacent the first metallic layer, the first inner major surface facing the first polymer layer;
a second metallic layer having a second outer major surface and a second inner major surface, the second inner major surface facing the first polymer layer, the first polymer layer disposed between the first and second metallic layers,
wherein each MEMS element in the one or more MEMS elements includes:
a first metallic region in the first metallic layer, the first metallic region including a first perforation;
a first voided region in the first polymer layer, the first voided region extending continuously through a thickness of the first polymer layer; and
a second metallic region in the second metallic layer, the second metallic region including a portion that is capable of a movement relative to the first metallic region.

15. The flexible film of claim 1, wherein the first polymer layer includes a polymer selected from the group consisting of polyimide, polycarbonate, polyethylene terephthalate, benzocyclobutene polymer, liquid crystal polymer and polydimethylsiloxane.

16. The flexible film of claim 1, wherein at least one of the first metallic layer and the second metallic layer includes a metal selected from the group consisting of copper, nickel, chromium, titanium, aluminum, gold, silver, beryllium and alloys thereof.

* * * * *

UNITED STATES PATENT AND TRADEMARK OFFICE
CERTIFICATE OF CORRECTION

PATENT NO. : 10,207,916 B2
APPLICATION NO. : 15/306569
DATED : February 19, 2019
INVENTOR(S) : Phillip Bergeron et al.

Page 1 of 1

It is certified that error appears in the above-identified patent and that said Letters Patent is hereby corrected as shown below:

In the Specification

Column 8
Line 3, Delete "5 m" and insert -- 5 mm --, therefor.

Signed and Sealed this
Twenty-ninth Day of October, 2019

Andrei Iancu
*Director of the United States Patent and Trademark Office*